United States Patent
Spessot et al.

(10) Patent No.: US 8,441,861 B2
(45) Date of Patent: May 14, 2013

(54) SELF-CHECK CALIBRATION OF PROGRAM OR ERASE AND VERIFY PROCESS USING MEMORY CELL DISTRIBUTION

(75) Inventors: Alessio Spessot, Gradisca d'Isonzo (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 13/049,717

(22) Filed: Mar. 16, 2011

(65) Prior Publication Data

US 2012/0236653 A1 Sep. 20, 2012

(51) Int. Cl.
*G11C 11/34* (2006.01)
*G11C 16/06* (2006.01)

(52) U.S. Cl.
USPC .................................. 365/185.22; 365/185.2

(58) Field of Classification Search ............. 365/185.03, 365/185.18, 185.2 X, 185.22 O, 185.2, 185.22
See application file for complete search history.

(56) References Cited

U.S. PATENT DOCUMENTS

| | | | | |
|---|---|---|---|---|
| 7,742,339 B2 * | 6/2010 | Rizel et al. | ............... | 365/185.18 |
| 7,936,601 B2 * | 5/2011 | Kang et al. | ............... | 365/185.03 |
| 8,036,044 B2 * | 10/2011 | Dong et al. | ............... | 365/185.29 |
| 2008/0123406 A1 * | 5/2008 | Ho et al. | ............... | 365/185.03 |

* cited by examiner

*Primary Examiner* — VanThu Nguyen
(74) *Attorney, Agent, or Firm* — Knobbe Martens Olson & Bear LLP

(57) ABSTRACT

Apparatus and methods determine a program verify (PV) induced reading parameter distribution. A measured post-PV reading parameter distribution can be compared with an expected post-PV reading parameter distribution. For example, de-convolution can be applied to identify the PV induced reading parameter distribution. Based on the PV-induced reading parameter distribution, adjustments can be made to one or more parameters of the PV process.

23 Claims, 5 Drawing Sheets

SELF-CHECK CALIBRATION OF PROGRAM OR ERASE AND VERIFY PROCESS USING MEMORY CELL DISTRIBUTION

BACKGROUND

1. Field

Subject matter disclosed herein relates to a memory device, and more particularly to write or erase performance of a memory device.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, and phase-change memory, just to name a few examples.

A NAND flash memory cell may transition from one state to another state in response to a bias signal applied to a control gate of the memory cell. Application of such a bias signal may result in charging a floating gate disposed between the control gate and a channel of the memory cell. Consequently, an amount of such charge on the floating gate may determine whether the memory cell is conductive above a particular threshold voltage applied to the control gate during a process to read the memory cell. However, a memory cell's responsiveness to a particular bias signal may change over time due to physical changes within the memory cell that may result from aging and usage, for example. Thus, it may be difficult to select proper bias signals to program such memory cells as the memory cells physically change over time.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
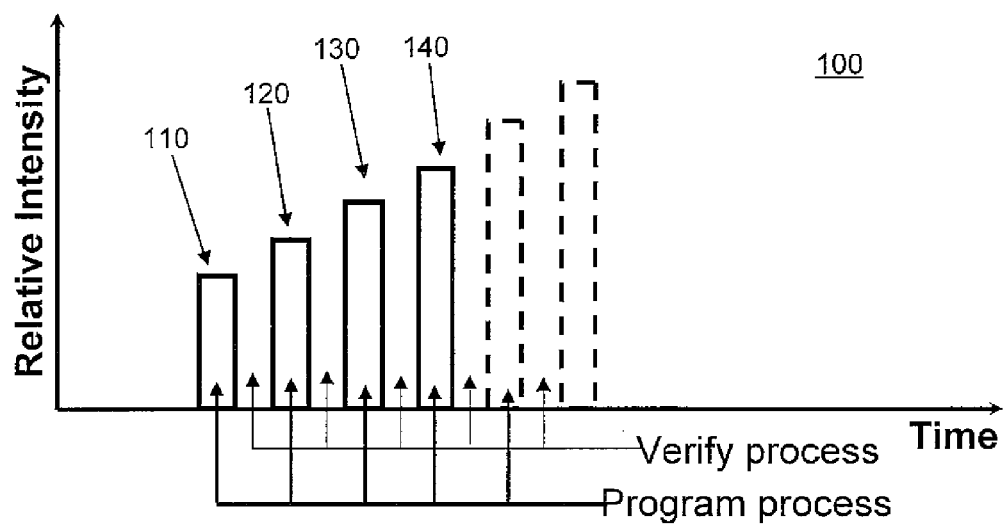
FIG. 1 is a plot of characteristics of program step pulses, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture to modify parameters used to program memory cells of a memory device. Parameters or program conditions, such as voltage amplitude, pulse width, or step size of program pulses, for example, may be modified in response to changes in a distribution of reading parameter of memory cells of the memory device. In particular, a reading parameter distribution resulting from a program-verify (PV) process or an erase-verify (EV) process may change over time for a memory device, even if the PV or EV process is not changed. For example, such a change may result from aging and/or usage of the memory device or portions thereof. Also, as a memory device ages, "optimal" program conditions for writing to the memory device may change or evolve. An ability to modify program conditions may lead to improved program speed or reliability of an aging memory device. Accordingly, changes in reading parameter distribution of memory cells subsequent to a PV or EV process may provide a metric by which effects of aging on the memory device may be determined or assessed. Also, such a metric may be used to determine whether program conditions are to be modified for subsequent PV or EV processes. "Reading parameter distribution" may refer to a distribution of reading parameters for a plurality of memory cells in a memory device. Such a plurality of memory cells may comprise a block, a page, a partition, or any portion of an array of memory cells, for example. A reading parameter of a memory cell refers to a threshold of voltage or current under which the cell is not programmed or erased and above which the memory cell is programmed or erased by an appropriate pulse. A reading parameter may also comprise resistance of a phase change memory cell or a resistive RAM device. Another example of a reading parameter may comprise a quantity of charge in a capacitor, such as in a dynamic random access memory (DRAM) or in a floating-body transistor used as a T-RAM or Z-RAM device, just to name a few examples.

In a particular embodiment, as mentioned above, parameters of a PV or EV process may be modified based, at least in part, on changes of a threshold voltage distribution of memory cells resulting from a PV or EV process applied to the memory cells. In one implementation, parameters of the PV or EV process may be dynamically modified during the PV or EV process, as described in detail below. In another implementation, parameters of the PV or EV process may be modified for subsequent PV or EV processes. Dynamic modification may allow program pulse parameters to be modified during a program process, for example. Such parameters may include program pulse amplitude, width, step size, and so on. A benefit of an ability to dynamically modify a PV or EV process, as described herein, is that values of PV or EV parameters established at the beginning of life for a memory device need not be selected as a compromise between "optimal" values of a new memory device and "optimal" values of the aged memory device. For example, a memory designer need not be concerned with selecting program pulse parameters that are merely acceptable during a whole life of a memory device. Instead, program pulse parameters may be initially selected to be most desirable for the new memory device because such program pulse parameters may be modified as the memory device ages. Of course, such details and benefits of modifying PV or EV parameters are merely examples, and claimed subject matter is not so limited.

In an embodiment, a method of programming a memory device may comprise reading memory cells of a memory array of the memory device to determine a threshold voltage distribution of the memory array subsequent to a program pulse applied to the memory cells. In one implementation, such a program pulse may comprise a first program pulse of a PV process. Such a PV process may comprise an incremental step pulse programming (ISPP) process, wherein a plurality of program pulses alternate with a plurality of verify processes, for example. In another implementation, such a program pulse may comprise a program pulse independent of a subsequent PV process. Continuing with the method of programming the memory device, a prediction of a threshold voltage distribution of the memory array resulting from the subsequent PV process may be calculated based, at least in part, on the determined threshold voltage distribution. Herein, a threshold voltage distribution of a memory array resulting from a PV process will be called a "post-PV threshold voltage distribution". Further, for convenience, a threshold voltage distribution may be referred to herein as simply a "distribution". Accordingly, the prediction of the post-PV distribution, mentioned above, may be referred to as an expected post-PV distribution. Processes to calculate such an expected post-PV distribution, and details thereof, are described below.

Continuing with the method of programming the memory device, a PV process may be applied to the memory cells. Subsequent to the applied PV process, the memory cells of the memory array may be read to determine a measured post-PV distribution of the memory array resulting from the applied PV process. A verify process may return threshold voltage values of memory cells corresponding to a state higher than a verify level "1". Similarly, a verify process may return threshold voltage values of memory cells corresponding to a state lower than a verify level "0". For example, a technique to capture a post-PV distribution may involve relatively fine resolution verify-sweeping. Comparing a measured post-PV distribution with an expected post-PV distribution (e.g., calculated previously, as described above), may provide information regarding changes in distribution of memory cells subsequent to PV processes over a lifetime of an aging memory device. Thus, such information may be used to determine whether program conditions for programming the memory device are to be modified for subsequent PV processes to account for the distribution changes.

In another embodiment, an expected post-PV distribution may be calculated relatively early in the lifetime of a memory device. In such a case, a computed expected post-PV distribution may be stored in a portion of the memory device or in an external memory device, for example. The stored expected post-PV distribution may then be used in a method of determining whether to modify program conditions of the memory device by comparing the stored expected post-PV distribution to a measured post-PV distribution, as described above. In one implementation, performing a method to determine whether to modify program conditions may be initiated in response to certain conditions such as the memory device exceeding a threshold number of PV cycles, a number of errors exceeding a threshold while reading or programming memory cells of the memory device, or a user or a processor executing an application, for example. Of course, such conditions initiating a process to modify program conditions of a memory device are merely examples, and claimed subject matter is not so limited. Although program and verify operations are discussed, embodiments described may also be applied to erase and verify operations.

FIG. 1 is a plot of characteristics of a program-verify (PV) bias signal 100 comprising program step pulses, according to an embodiment. A process of writing to a memory cell, which may use PV bias signal 100, may also comprise a process to verify that a particular bit was successfully written to the memory cell of a memory array. Such a memory cell may comprise any of a number of types of memory technologies, including, but not limited to, NAND or NOR flash memory, and phase change memory (PCM), just to name a few examples. Program step pulses and verify processes may be alternately performed during a PV process. In a particular example, a first program pulse may be applied to a memory cell to program the memory cell to a set state. A verify process may follow the first program pulse to determine whether or not the memory cell was successfully programmed to a set state. If not, then a second program pulse having a higher magnitude than that of the first program pulse may be applied to the memory cell. A verify process may then be repeated, and so on. Such a memory cell may comprise a single level cell or a multi-level cell, for example. In one implementation, an ISPP process may be used, in which a magnitude of a program pulse applied to a control gate of a particular memory cell may be sequentially increased until the particular memory cell is determined to be successfully programmed. As discussed in detail below, parameters of a PV bias signal, such as program pulse width, peak amplitude, step size between consecutive program pulses, and so on may be modified based, at least in part, on a comparison between measured and expected post-PV distributions of a memory array that includes the particular memory cell.

PV bias signal 100 may comprise one or more individual program pulses applied to a memory cell until the memory cell transitions to a programmed state. PV bias signal 100 may comprise a voltage signal applied to a control gate (e.g., a wordline) of memory cells of a memory array, for example. In particular, subsequent program pulses may have a greater peak amplitude than a previous program pulse. In one implementation, a series of such program pulses may comprise a waveform having individual peak amplitudes that sequentially increase from one pulse to the next. Such an implementation may address changes in physical and/or electrical characteristics of a plurality of memory cells in a memory device, for example. As shown in FIG. 1, a first program pulse 110 may be followed by a second program pulse 120 having a peak amplitude higher than that of the first program pulse. According to an ISPP process, and as mentioned above, a verify process may be performed between consecutive program pulses of PV bias signal 100. Such a verify process may be used to determine whether programming a memory cell using a preceding program pulse was successful or not. For example, first program pulse 110 applied to a memory cell may be followed by a verify process to determine whether the memory cell was successfully programmed by program pulse 110. If so, then PV bias signal 100 may no longer be applied to the memory cell (e.g., subsequent program pulses 120, 130, 140, and so on need not be applied to the memory cell). However, if the memory cell was not successfully programmed, then second program pulse 120, having a peak amplitude higher than that of first program pulse 110 may be applied to the memory cell. As before, second program pulse 120 applied to the memory cell may be followed by a verify process to determine whether the memory cell was successfully programmed by program pulse 120. If so, then PV bias signal 100 may no longer be applied to the memory cell (e.g., subsequent program pulses 130, 140, and so on need not be applied to the memory cell). However, if the memory cell was not successfully programmed, then third program pulse 130, having a peak amplitude higher than that of second program pulse 120 may be applied to the memory cell. Such a process may continue until the program pulse is successfully programmed. Such a PV bias signal 100, of course, may comprise a variety of characteristic shapes and/or configurations, and claimed subject matter is not limited in this respect.

Figure 2:
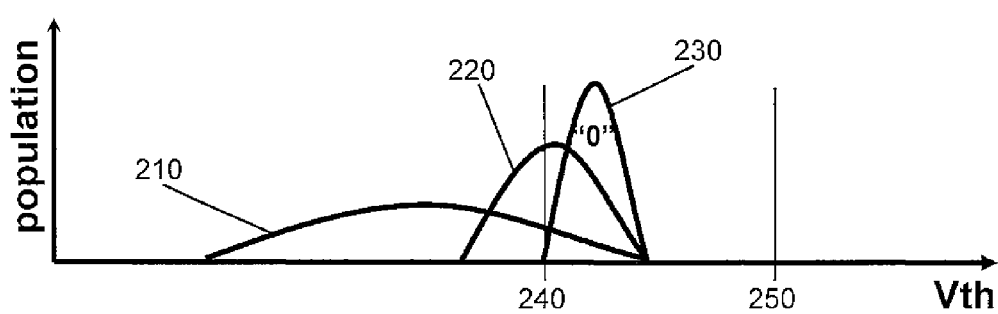
FIG. 2 is a plot showing threshold voltage distributions for a population of memory cells in a memory array, according to an embodiment.

FIG. 2 is a plot showing threshold voltage distributions 200 for a population of memory cells programmed by the application of PV bias signal 100, shown in FIG. 1, for example, according to an embodiment. Such distributions may arise from physical variations of memory cells in an array due to usage (e.g., program-erase cycles), fabrication, dimensional variations (e.g., floating gate and/or surrounding dimensions) and/or location on a semiconductor wafer, for example. To elaborate, variations in fabrication conditions from lot to lot and/or from region to region on a semiconductor wafer, for example, may lead to variations in characteristics and/or physical parameters of memory cells. Of course, such variations may result from any of a number of situations or conditions. For another example, physical position of a memory cell in a circuit may affect and/or modify physical parameters of the memory cell. In particular, capacitance, magnetic and electric fields, and/or heat may contribute to such variations, though claimed subject matter is not limited in this respect. Since one portion of memory cells in a memory array may behave differently from another portion of memory cells, some memory cells may respond to a particular bias signal differently from how other memory cells may respond. Accordingly, one portion of memory cells in an array may behave differently from another portion of memory cells in response to an applied bias signal having a particular magnitude. For example, a particular magnitude of a program pulse applied to one memory cell may result in the memory cell being programmed to a set state, while the same program pulse applied to another memory cell may result in the memory cell failing to be programmed to a set state (so that another, higher magnitude program pulse may be applied if the memory cell is to finally be programmed to such a set state, for example).

Variations of properties of a population of memory cells in an array, as discussed above, may lead to a distribution 210 of threshold voltages of the memory cells after receiving a first program pulse 110. Such a relatively broad distribution may be narrowed by applying subsequent program pulses 120, 130, and so on of PV bias signal 100. For example, applying second and third program pulses 120 and 130 to the memory cells may lead to a distribution 220 of threshold voltages. Continuing, applying subsequent program pulses 140 and so on to the memory cells may lead to a distribution 230 of threshold voltages. Herein, distribution 230 may be referred to as a post-PV distribution. In detail, such program pulses may be applied only to memory cells that are determined (e.g., by a verify process performed between program pulses, as described above) to have a threshold voltage below a particular value 240, herein called a program-verify (PV) level. In this fashion, program pulses having increasingly large magnitudes may be sequentially applied to memory cells until the memory cells finally have threshold voltages at or above PV level 240. In an implementation, PV level 240 may be below a read voltage level 250, for example.

As mentioned above, variations of properties of a population of memory cells in an array may lead to a distribution 210 of the memory cells. Also, a program pulse height and/or width may also contribute to distribution 210. In addition, a variation of PV level 240 may contribute to post-PV distribution 230. Such a contribution is herein called a PV-induced distribution spread. As a memory device ages and/or cycles through program/erase processes, PV-induced distribution spread may increase, thus representing a degradation of the memory device.

Figure 3:
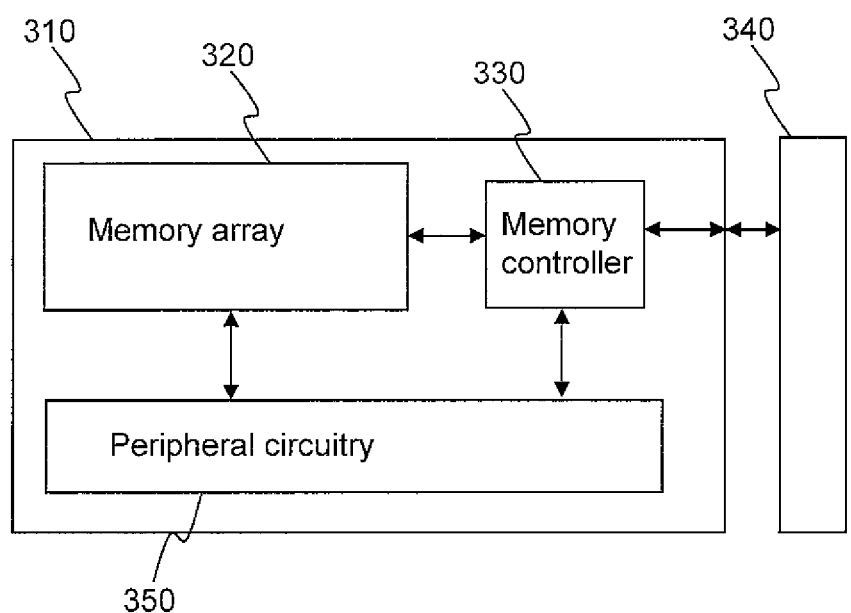
FIG. 3 is a schematic block diagram of a memory device, according to an embodiment.

FIG. 3 is a block diagram of a memory device, according to an embodiment. In particular, a memory device 310 may include a memory array 320, a memory controller 330, or peripheral circuitry 350. Such peripheral circuitry may comprise sensing circuitry (e.g., sense amplifiers), power supplies (e.g., inverters, voltage-boosting circuitry, and so on), and/or buses, for example. Memory controller 330 may be adapted to receive program, erase, and/or read commands from outside memory device 310, such as from a processing entity 340. Memory controller 330 may also be adapted to perform program, erase, and/or read operations on memory array 320 in response to such commands. In an implementation, memory controller 330 may perform a method of determining whether to modify program conditions of the memory device by comparing expected post-PV distribution to a measured post-PV distribution, as described above. Such an expected post-PV distribution may be updated or calculated by memory controller 330 or may be provided by processing entity 340, a portion of memory array 320, or an external memory or other external source, for example. In addition, in one implementation, memory controller 330 may calculate a measured post-PV distribution using data read from memory array 320. In another implementation, memory controller 330 may provide data read from memory array 320 to processing entity 340 so that processing entity 340 may calculate a measured post-PV distribution, for example. As mentioned above, memory device 310 need not be limited to any particular type of memory technology. For example, memory device 310 may comprise NAND flash, NOR flash, or PCM, just to name a few examples. Of course, such details of memory device 310 are merely examples, and claimed subject matter is not so limited.

Figure 4:
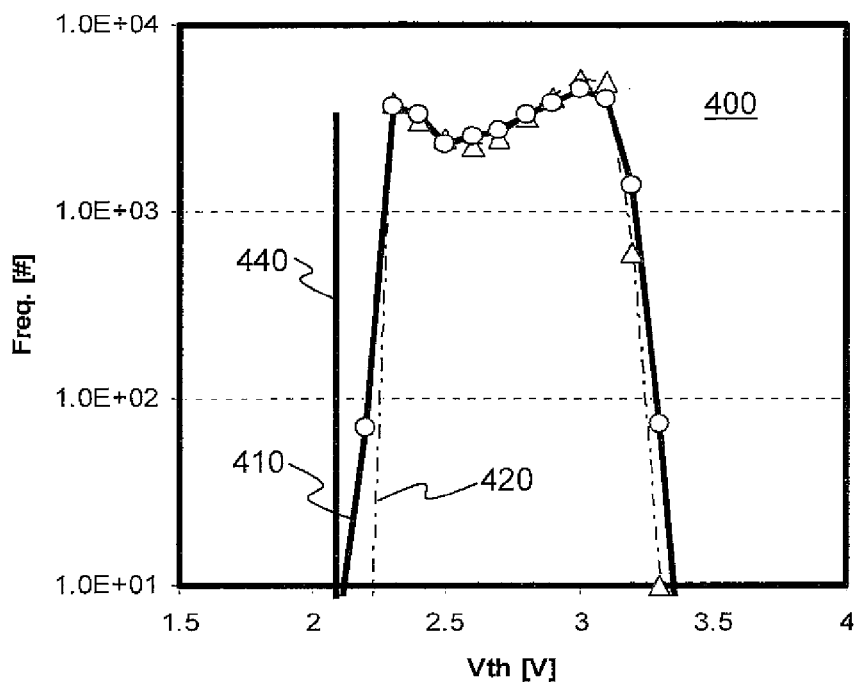
FIG. 4 is a plot of a threshold voltage distribution for a population of memory cells in a memory array, according to an embodiment.

FIG. 4 is a plot 400 showing threshold voltage distributions for a population of memory cells in a memory array, according to an embodiment. Such distributions of memory cells may be affected by applying PV bias signal 100, shown in FIG. 1, for example, to memory cells of the memory array. In other words, memory cells may have been programmed by a PV bias signal 100 comprising a series on increasing-magnitude program pulses (e.g., step pulses), as discussed above. In particular, such programming may lead to programmed memory cells having a threshold voltage equal to or greater than a program-verify voltage PV. Thus, such distributions may comprise post-PV distributions resulting from a PV process applied to the memory array. For example, such post-PV distributions may be similar to distribution 230 shown in FIG. 2. For a particular memory array, distribution 410 may comprise a measured post-PV distribution and distribution 420 may comprise a computed expected post-PV distribution. PV level 440 may be similar to PV level 240 shown in FIG. 2, for example. Measured post-PV distribution 410 may result from an nth number of program pulses of a PV process, wherein n may comprise an integer greater than one. As an illustrative example, measured post-PV distribution 410 may comprise experimental data resulting from seven program pulses of a PV process (n=7). To compare, returning to FIG. 2, post-PV distribution 230 may result from three program pulses of a PV process (n=3). As explained above, measured post-PV distribution 410 may be calculated by a memory controller or a processor using read array data.

Expected post-PV distribution 420 of a memory array may result from calculations based, at least in part, on theoretical and/or experimental models of the memory array using a measured distribution resulting from a single program pulse, for example. In other words, expected post-PV distribution 420 may result from simulating a PV process (e.g., involving multiple program pulse) beginning with a real measured distribution resulting from merely a single program pulse. Thus expected post-PV distribution 420, generated by simulation, need not include PV process effects from an aging memory array. In other words, expected post-PV distribution 420 may be independent of effects resulting from applying an actual PV process to the memory array. Accordingly, differences between expected post-PV distribution 420 and measured post-PV distribution 410 may reveal such PV process effects, such as a PV-induced distribution spread, introduced above. Such PV process effects may comprise an undesirable enlargement in width (e.g., spread) of a post-PV distribution, which may change as the memory array ages, for example. Program parameters may change accordingly. As explained above, expected post-PV distribution 420 may be calculated by a memory controller or a processor using read array data resulting from a single program pulse. In another implementation, however, expected post-PV distribution 420 may be retrieved from a memory by a memory controller or a processor. In such a case, post-PV distribution 420 may have been calculated relatively early in a lifetime of the memory device and maintained during the lifetime of the memory device.

Figure 5:
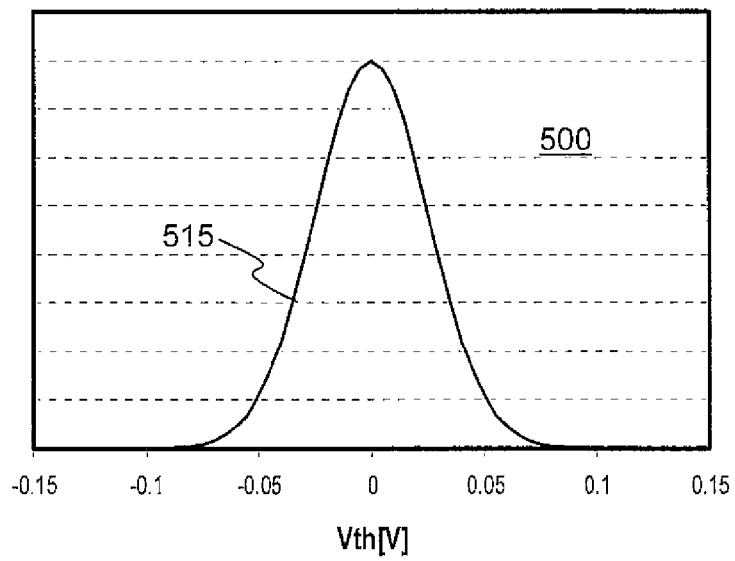
FIG. 5 is a plot showing a program-verify spread distribution for a population of memory cells in a memory array, according to an embodiment.

FIG. 5 is a plot 500 showing a PV-induced distribution spread 515 for a population of memory cells in a memory array, according to an embodiment. As indicated above, measured post-PV distribution 410 may be based, at least in part, on a PV-induced distribution spread, whereas expected post-PV distribution 420 may be independent of a PV-induced distribution spread. Accordingly, a contribution of the PV-induced distribution spread 515 may be isolated or obtained by comparing the measured post-PV distribution 410 to the expected post-PV distribution 420. In one implementation, such comparing may comprise a process of de-convolution using, for example, a technique to algorithmically remove the PV-induced distribution spread from the measured post-PV distribution 410 by using the expected post-PV distribution 420. A de-convolution process may be performed using either a software procedure or dedicated hardware. In some cases, a recursive iterative procedure may be used, for example. Using such a process, a calibration of the PV-induced distribution spread for different programming condition (e.g., varying program pulse time and/or height) may be obtained, tabulated and/or stored by memory controller 330 or processing entity 340 shown in FIG. 3, for example. Such stored calibration data may be used during a lifetime of the memory device to modify program parameters of a PV process as the memory device ages, for example. Of course, such details regarding use-history information are merely examples, and claimed subject matter is not so limited.

Figure 6:
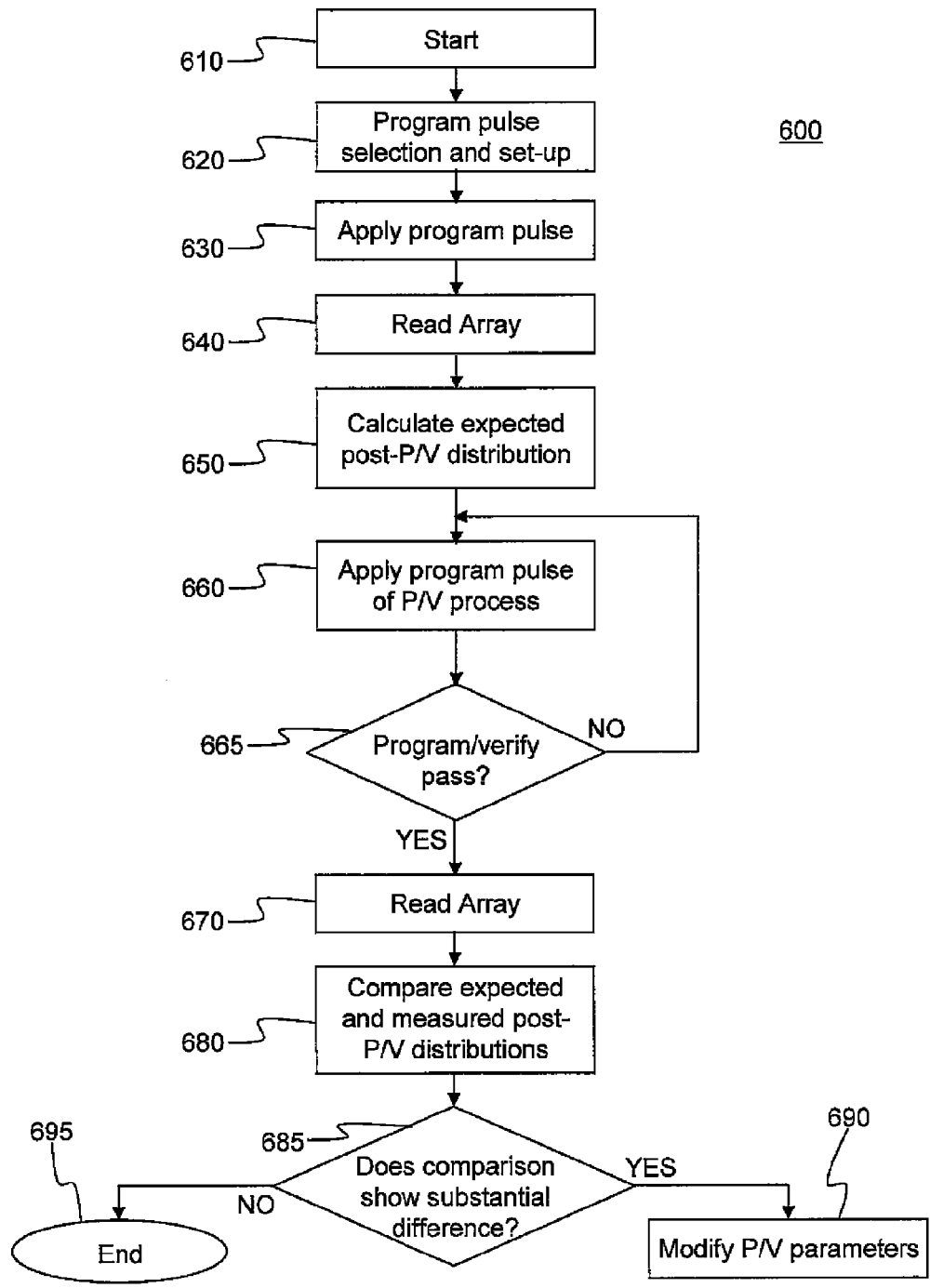
FIG. 6 is a flow diagram of a program-verify process, according to an embodiment.

FIG. 6 is a flow diagram of a program-verify process 600, according to an embodiment. For example, a memory controller may perform process 600 to program a memory cell in a memory array of a memory device in response to receiving program instructions from a processor executing a program. Such a memory cell may comprise a NAND flash cell, a NOR flash cell, or a PCM cell, for example. At block 610, a memory controller, a processor, or a user may determine whether to initiate process 600. For example, process 600 may be initiated by an event performed by the memory device that exceeds a threshold number of PV cycles experienced by the memory array. In another example, process 600 may be initiated by an event performed by the memory device that exceeds a threshold number of errors while reading or programming said memory cells. In yet another example, process 600 may be initiated by a user or a processor executing an application. In still another example, process 600 may be initiated from time to time during a lifetime of the memory device.

At block 620, a memory controller may select parameters for an initial program pulse, such as program pulse 110 shown in FIG. 1. Such parameters may include, but are not limited to, voltage amplitude, pulse width, and voltage amplitude step size for a subsequent program pulse (e.g., program pulse 120). At block 630, a memory controller may apply a first program pulse via a wordline to control gates of the memory array. However, in an implementation, such a program pulse need not comprise a first pulse of a PV process. For example, the program pulse may comprise a single program pulse independent of program pulses that follow during a subsequent PV process (as in block 660). At block 640, subsequent to applying the program pulse, the memory controller may read memory cells of the memory array. At block 650, using data read from the memory array, an expected post-PV distribution may be calculated, as described above. Such an expected post-PV distribution may be stored and used in block 680, described below, for example. At block 660, a first program pulse (or a second program pulse, if the program pulse of block 630 comprised a first program pulse) of the PV process may be applied to the memory array. At diamond 665, by reading the state of the memory cells of the memory array, the memory controller may determine (e.g., verify) whether the memory cells were successfully programmed by the first program pulse. If so, then the PV process may be complete. If, however, at least a portion of the memory cells were not successfully programmed by the first program pulse, then process 600 may return to block 660, where the PV process may include applying a second program pulse to the as yet un-programmed memory cells. Such a subsequent program pulse may have a voltage amplitude larger by a step size than the voltage amplitude of the previous program pulse, as explained above. Process 600 may then repeat such program and verify processes as in block 660 and diamond 665 until the memory cells of the array are verified to be successfully programmed. At such a conclusion of the PV process, process 600 may proceed to block 670, where the memory controller may read memory cells of the memory array. Using data read from the memory array, a post-PV distribution may be measured, as described above.

At block 680, comparing the measured post-PV distribution with the expected post-PV distribution calculated at block 650 may reveal a substantial difference between the measured post-PV distribution and the expected post-PV distribution. Such a difference may be manifested as a PV-induced distribution spread, such as the distribution curve 515 shown in FIG. 5, for example. Upon determining such a substantial difference, as at diamond 685, process 600 may proceed to block 690, where PV parameters may be modified for subsequent PV processes, as described above. On the other hand, if no such substantial difference is present, then process 600 may end with no such parameter modification.

Figure 7:
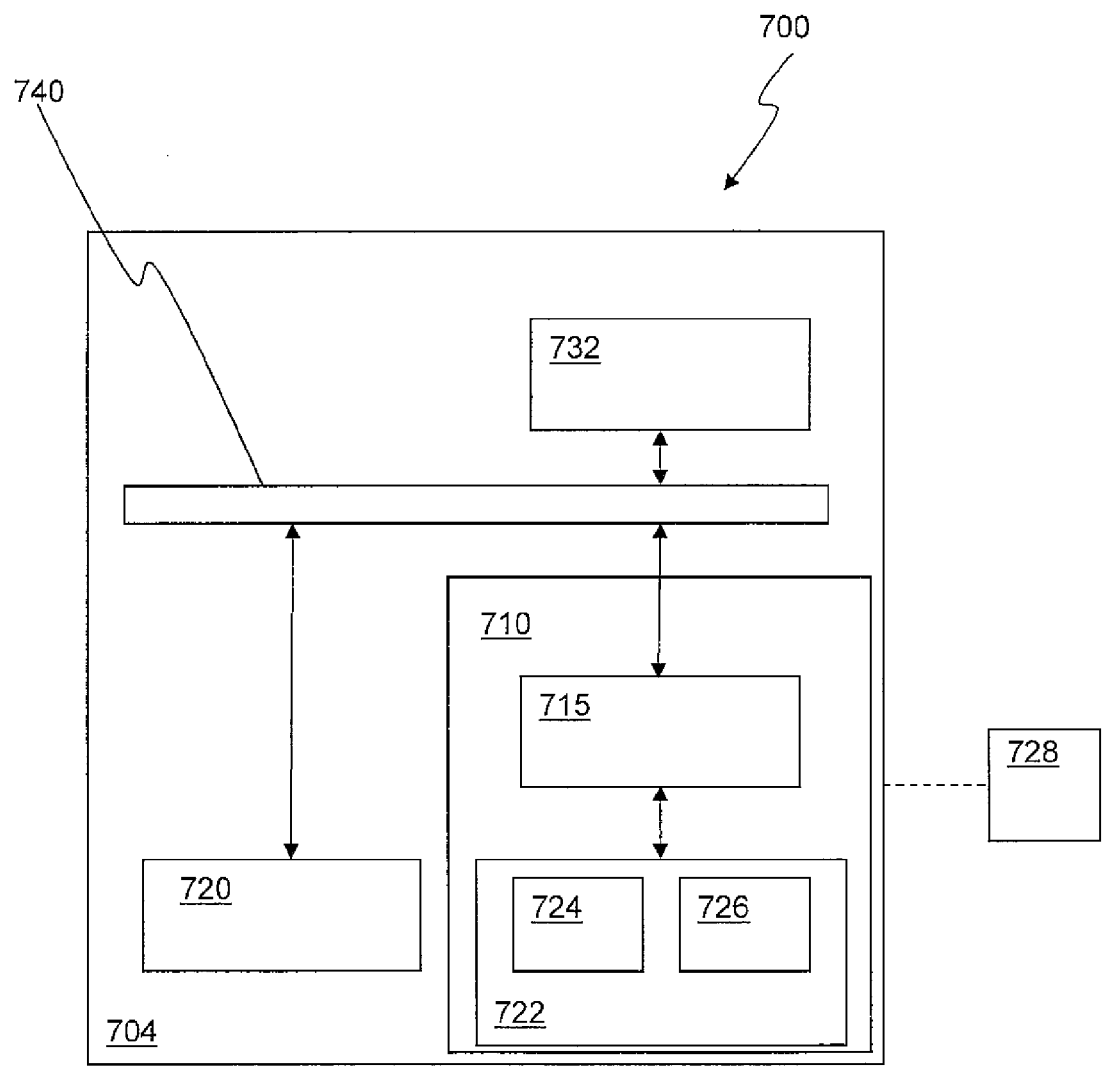
FIG. 7 is a schematic diagram illustrating an exemplary embodiment of a computing system.

FIG. 7 is a schematic diagram illustrating an exemplary embodiment of a computing system 700 including a memory device 710. Such a computing device may comprise one or more processors, for example, to execute an application and/or other code. A computing device 704 may be representative of any device, appliance, or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may include an operating system configured to communicate with memory controller 715. Such an operating system may, for example, generate commands to be sent to memory controller 715 over bus 740. In one implementation, memory controller 715 may comprise an internal memory controller or an internal write state machine, wherein an external memory controller (not shown) may be external to memory device 710 and may act as an interface between the system processor and the memory itself, for example. Such commands may comprise read and/or write commands. In response to a write command, for example, memory controller 715 may provide a bias signal, such as bias signal 100 comprising a series of set pulses having individual peak amplitudes that sequentially increase from one pulse to the next, shown in FIG. 1, for example. In particular, memory controller 715 may determine a distribution of a memory array subsequent to a program pulse applied to said memory cells, generate an expected post-PV distribution of the memory array based, at least in part, on the determined distribution, measure a post-PV distribution of the memory array subsequent to a PV process applied to the memory cells, and determine a PV-induced distribution spread based, at least in part, on a comparison between the measured and the expected post-PV distributions.

Memory array 722 is representative of any data storage mechanism. Memory array 722 may include, for example, a primary memory and/or a secondary memory. A primary memory may include, for example, a random access memory, read only memory, etc. While illustrated in this example as being separate from processing unit 720, it should be understood that all or part of memory array 722 may be provided within or otherwise co-located/coupled with processing unit 720. A secondary memory may include, for example, the same or similar type of memory as primary memory and/or one or more data storage devices or systems, such as, for example, a disk drive, an optical disc drive, a tape drive, a solid state memory drive, etc. In certain implementations, a secondary memory may be operatively receptive of, or otherwise configurable to couple to, a computer-readable medium 728. Computer-readable medium 728 may include, for example, any medium that can carry and/or make accessible data, code, and/or instructions for one or more of the devices in system 700.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method of operating a memory cell, the method comprising:
   reading memory cells of a memory array to determine a reading parameter distribution of said memory array subsequent to a program or erase pulse applied to said memory cells;
   determining an expected post-program-verify (post-PV) reading parameter distribution of said memory array based, at least in part, on said determined reading parameter distribution;
   reading said memory cells of said memory array to determine a measured post-PV reading parameter distribution of said memory array subsequent to a program verify (PV) process applied to said memory cells; and
   determining a PV-induced reading parameter distribution spread based, at least in part, on a comparison between said measured and said expected post-PV reading parameter distributions, wherein determining further comprises identifying the PV-induced reading parameter distribution by performing de-convolution to algorithmically remove the PV-induced reading parameter distribution spread from the measured post-PV reading parameter distribution by using the expected post-PV reading parameter distribution.

2. The method of claim 1, further comprising:
   adjusting one or more parameters of said PV process based, at least in part, on said comparison between said measured and said expected post-PV reading parameter distributions.

3. The method of claim 2, wherein said parameters of said PV process comprise pulse amplitude, pulse width, and/or pulse step size.

4. The method of claim 1, wherein said PV process comprises an incremental step pulse programming (ISPP) process, wherein a plurality of program pulses alternate with a plurality of verify processes.

5. The method of claim 1, further comprising:
   maintaining said post-PV reading parameter distribution information in a memory.

6. The method of claim 1, wherein said determining said PV-induced reading parameter distribution spread is initiated by exceeding a threshold number of PV cycles experienced by said memory cells.

7. The method of claim 1, wherein said determining said PV-induced reading parameter distribution spread is initiated by exceeding a threshold number of errors while reading, erasing, or programming said memory cells.

8. The method of claim 1, wherein said determining said PV-induced reading parameter distribution spread is user-initiated.

9. An apparatus comprising:
a controller configured to:
- determine a reading parameter distribution of a memory array subsequent to a pulse applied to memory cells of said memory array;
- generate an expected post-program-verify (post-PV) reading parameter distribution of said memory array based, at least in part, on said determined reading parameter distribution;
- measure a post-PV reading parameter distribution of said memory array subsequent to a program verify (PV) process applied to said memory cells; and
- determine a PV-induced reading parameter distribution spread based, at least in part, on a comparison between said measured and said expected post-PV reading parameter distributions, wherein the controller is configured to determine the PV-induced reading parameter distribution by performing de-convolution to algorithmically remove the PV-induced reading parameter distribution spread from the measured post-PV reading parameter distribution with the expected post-PV reading parameter distribution.

10. The apparatus of claim 9, wherein said controller is adapted to adjust one or more parameters of said PV process based, at least in part, on said comparison between said measured and said expected post-PV reading parameter distributions.

11. The apparatus of claim 10, wherein said parameters of said PV process comprise pulse amplitude, pulse width, and/or pulse step size.

12. The apparatus of claim 9, wherein said PV process comprises an incremental step pulse programming (ISPP) process, wherein a plurality of program pulses alternate with a plurality of verify processes.

13. The apparatus of claim 9, wherein said controller is adapted to maintain said post-PV reading parameter distribution information in a portion of said memory array.

14. The apparatus of claim 9, wherein said determining said PV-induced reading parameter distribution spread is initiated by exceeding a threshold number of PV cycles or erase cycles experienced by said memory cells.

15. A system comprising:
a memory device comprising a memory array, said memory device further comprising a memory controller configured to:
- determine a reading parameter distribution of said memory array subsequent to said memory controller applying a pulse to memory cells of said memory array;
- calculate an expected post-program-verify (post-PV) reading parameter distribution of said memory array based, at least in part, on said determined reading parameter distribution;
- read said memory cells of said memory array to determine a measured post-PV reading parameter distribution of said memory array subsequent to a program verify (PV) process applied to said memory cells;
- determine a PV-induced reading parameter distribution spread based, at least in part, on a comparison between said measured and said expected post-PV reading parameter distributions, wherein the memory controller is configured to determine the PV-induced reading parameter distribution by performing de-convolution to algorithmically remove the PV-induced reading parameter distribution spread from the measured post-PV reading parameter distribution by using the expected post-PV reading parameter distribution; and a processor to host one or more applications and to command said memory controller to program or erase said memory cells in said memory array.

16. The system of claim 15, wherein said memory controller is adapted to adjust one or more parameters of said PV process based, at least in part, on said comparison between said measured and said expected post-PV reading parameter distributions.

17. The system of claim 16, wherein said parameters of said PV process comprise pulse amplitude, pulse width, and/or pulse step size.

18. The system of claim 15, wherein said PV process comprises an incremental step pulse programming (ISPP) process, wherein a plurality of program pulses alternate with a plurality of verify processes.

19. The system of claim 15, wherein said memory controller is adapted to maintain said post-PV reading parameter distribution information in a portion of said memory array.

20. The system of claim 15, wherein said determining said PV-induced reading parameter distribution spread is initiated by exceeding a threshold number of PV cycles or erase cycles experienced by said memory cells.

21. The method of claim 1, wherein de-convolution comprises a recursive iterative procedure.

22. The apparatus of claim 9, wherein de-convolution comprises a recursive iterative procedure.

23. The system of claim 15, wherein de-convolution comprises a recursive iterative procedure.

* * * * *